United States Patent
Shim

(10) Patent No.: US 7,170,127 B2
(45) Date of Patent: Jan. 30, 2007

(54) SEMICONDUCTOR DEVICE AND FABRICATING METHOD THEREOF

(75) Inventor: Hee Sung Shim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 104 days.

(21) Appl. No.: 11/026,171

(22) Filed: Dec. 29, 2004

(65) Prior Publication Data

US 2005/0142732 A1 Jun. 30, 2005

(30) Foreign Application Priority Data

Dec. 31, 2003  (KR) .................. 10-2003-0101555

(51) Int. Cl.
  *H01L 27/108* (2006.01)
  *H01L 29/76* (2006.01)
  *H01L 29/94* (2006.01)
  *H01L 31/119* (2006.01)

(52) U.S. Cl. .............. 257/306; 257/303; 438/254

(58) Field of Classification Search ........ 257/303, 257/304, 306, 309, 310; 438/254, 396, 397, 438/398, 399

See application file for complete search history.

(56) References Cited

U.S. PATENT DOCUMENTS

| 5,807,782 | A | * | 9/1998 | Koh et al. .................. 438/396 |
| 6,249,054 | B1 | | 6/2001 | Tanigawa |
| 6,387,775 | B1 | | 5/2002 | Jang et al. |
| 6,410,381 | B2 | | 6/2002 | Kim et al. |
| 6,528,366 | B1 | | 3/2003 | Tu et al. |
| 6,559,493 | B2 | | 5/2003 | Lee et al. |
| 6,794,702 | B2 | | 9/2004 | Park |
| 6,825,521 | B2 | * | 11/2004 | Komuro .................. 257/311 |

* cited by examiner

*Primary Examiner*—Phuc T. Dang
(74) *Attorney, Agent, or Firm*—Andrew D. Fortney

(57) ABSTRACT

The present invention provides a semiconductor device and fabricating method thereof, by which capacitance is enhanced by increasing an effective area of a lower electrode of a capacitor. The present invention includes a first lower electrode on a semiconductor substrate to have a plate shape, a second lower electrode on the first electrode to have a ㅋF type (or "wing"-type) cross-section, a dielectric layer covering surfaces of the first and second lower electrodes, and an upper electrode on the dielectric layer.

8 Claims, 5 Drawing Sheets

SEMICONDUCTOR DEVICE AND FABRICATING METHOD THEREOF

This application claims the benefit of the Korean Application No. P2003-0101555 filed on Dec. 31, 2003, which is hereby incorporated by reference.

BACKGROUND OF THE INVENTION

1. Field of the Invention

The present invention relates to a semiconductor device and fabricating method thereof, and more particularly, to a capacitor and a fabricating method thereof, by which capacitance is enhanced by increasing an effective area of a lower electrode of the capacitor.

2. Discussion of the Related Art

Generally, in a unit cell configured with a MOS transistor and a capacitor, device characteristics are considerably affected by capacitance of the capacitor. As a capacitor occupying area is reduced according to a highly increasing degree of semiconductor device integration, large capacitance of a capacitor is badly needed more than ever.

To increase capacitance of a capacitor, there are various methods such as a method of increasing an effective area of a capacitor, a method of thinning a dielectric layer between upper and lower electrodes, a method of forming a dielectric layer of a high dielectric constant, and the like.

Yet, the method of thinning a dielectric layer lowers reliability of a semiconductor device. And, the method of forming a dielectric layer of a high dielectric constant needs to develop a new capacitor fabricating process.

Hence, many efforts are made to develop the method of increasing an effective area.

FIG. 1 is a cross-sectional diagram of a capacitor in a semiconductor device according to a related art.

Referring to FIG. 1, a lower electrode 102, a dielectric layer 104, and an upper electrode 105 are sequentially stacked on a semiconductor substrate 101 to configure a capacitor embedded in an insulating interlayer 103.

In such a capacitor structure of the related art, since the lower electrode 102 has a planar shape, an area of the lower electrode 102 is decreased according to a reduced design rule of semiconductor device.

Hence, a structural limitation is put on the related art capacitor in maximizing capacitance in a microscopic device.

SUMMARY OF THE INVENTION

Accordingly, the present invention is directed to a semiconductor device and fabricating method thereof that substantially obviates one or more problems due to limitations and disadvantages of the related art.

An object of the present invention is to provide a semiconductor device and fabricating method thereof, by which capacitance is enhanced by increasing an effective area of a lower electrode of a capacitor.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a semiconductor device according to the present invention includes a first lower electrode on a semiconductor substrate, a second lower electrode on the first electrode having a ㅋF type or "wing"-type cross-section, a dielectric layer covering surfaces of the first and second lower electrodes, and an upper electrode on the dielectric layer.

In another aspect of the present invention, a method of fabricating a semiconductor device includes the steps of forming a first lower electrode on a substrate, sequentially stacking a first sacrificial layer, a first metal layer, and a second sacrificial layer on the first lower electrode, forming a trench by etching the second sacrificial layer, the first metal layer, and the first sacrificial layer to expose a central part of the first lower electrode, forming a second metal layer over the substrate including the exposed central part of the first lower electrode and the second sacrificial layer, patterning the second metal layer, the second sacrificial layer, the first metal layer, and the first sacrificial layer, removing the remaining first and second sacrificial layers to expose a second lower electrode, forming a dielectric layer covering surfaces of the first and second lower electrodes, and forming an upper electrode on the dielectric layer.

Preferably, the first and second sacrificial layers comprise an oxide.

Preferably, the first and second sacrificial layers are removed by wet etching.

Preferably, the dielectric layer is formed by chemical vapor deposition.

Preferably, the upper electrode forming step includes the steps of forming a third metal layer over the dielectric layer and patterning the third metal layer and the dielectric layer.

More preferably, the third metal layer is formed by chemical vapor deposition.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
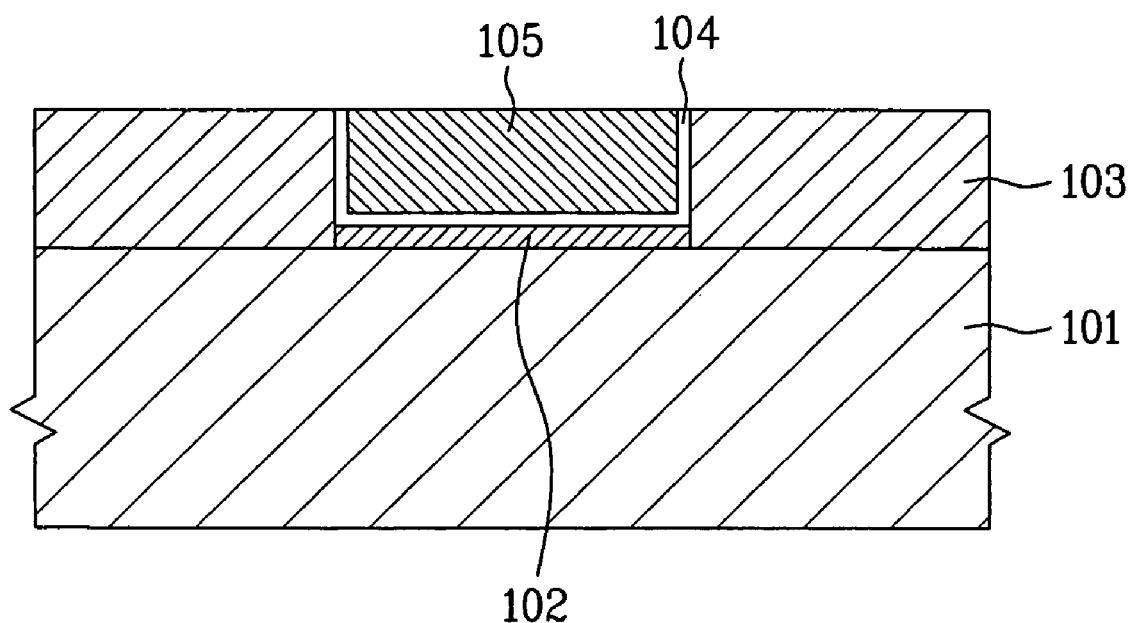
FIG. 1 is a cross-sectional diagram of a capacitor in a semiconductor device according to a related art.
Figure 2:
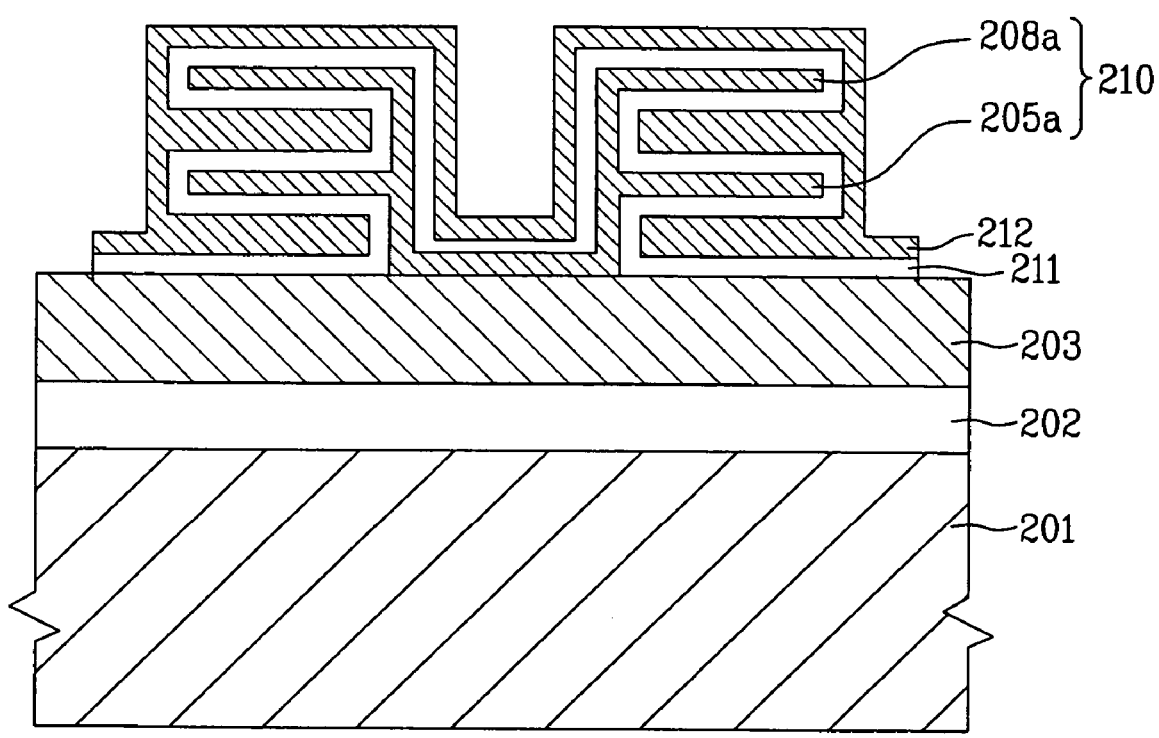
FIG. 2 is a cross-sectional diagram of a capacitor in a semiconductor device according to the present invention.

FIG. 2 is a cross-sectional diagram of a capacitor in a semiconductor device according to the present invention.

Referring to FIG. 2, a capacitor according to the present invention includes a lower electrode, a dielectric layer, and an upper electrode.

Specifically, the lower electrode having a shelf shape includes a first lower electrode 203 having a planar shape and a second lower clectrode 210 on the first lower electrode 203. And, the second lower clectrode 210 has a ᄏF type or wing-type cross-section. The term "wing-type cross section" generally means that the electrode has a plurality of substantially horizontal plates with at least one insulating material interposed between any two adjacent plates, preferably where there is also at least one substantially horizontal plate of an adjacent electrode interposed between two such adjacent plates of the wing-type electrode, insulated from the wing-type electrode plates by the insulating material. The first lower electrode 203 may include an Al layer and a Ti/TiN layer stacked on the Al layer. And, the second lower electrode 210 may comprise a Ti/TiN bilayer.

And, the dielectric layer 211 is formed on a surface of the lower electrode 203 and 210.

Moreover, the upper electrode 212 is formed on a surface of the dielectric layer 211.

Hence, capacitance of the capacitor of the present invention is increased since an effective area of the lower electrode 203 and 210 contacting with the dielectric layer 211 is mostly increased due to the second lower electrode 210.

FIGS. 3A to 3E are cross-sectional diagrams for explaining a method of fabricating a capacitor in a semiconductor device according to the present invention.

Figure 3A:
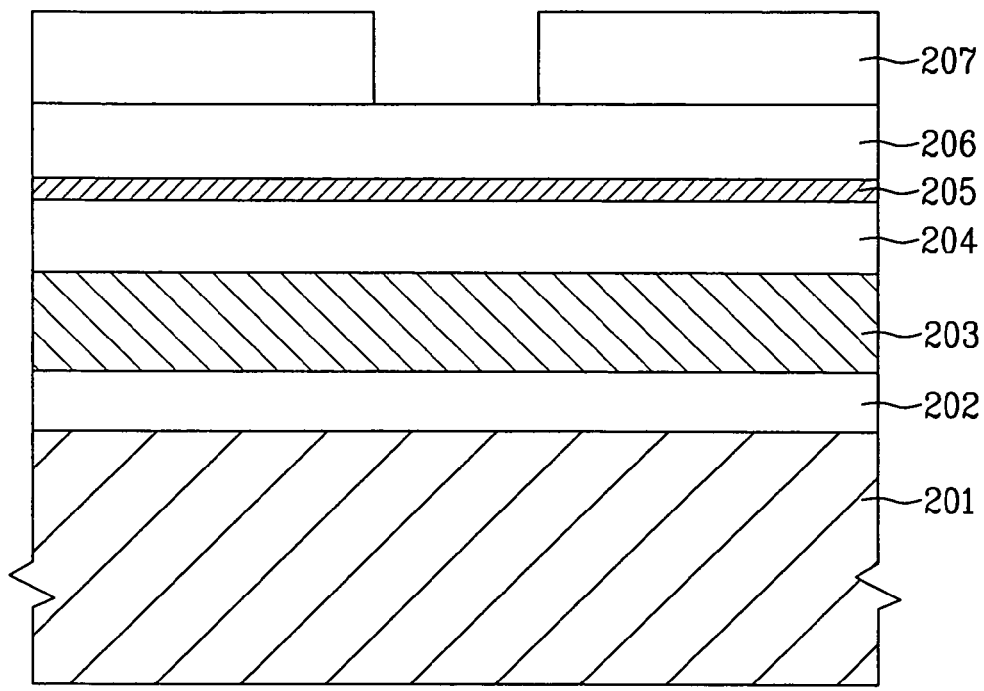
FIGS. 3A to 3E are cross-sectional diagrams for explaining a method of fabricating a capacitor in a semiconductor device according to the present invention.

Referring to FIG. 3A, an insulating interlayer is deposited on a semiconductor substrate 201. In doing so, the insulating interlayer 202 is formed of a general oxide layer such as BPSG (borophosphosilicate glass) and the like. Besides, a device (not shown in the drawing) such as a MOS transistor and the like is formed on an active area of the substrate 201 under the insulating interlayer 202.

A first metal layer is deposited 1,000~1,500 Å thick on the insulating interlayer 202. The first metal layer is patterned by photolithography to form a first lower electrode 203. In doing so, the metal layer for forming the first lower electrode 203 preferably comprises Al or Al—Cu alloy. Alternatively, the first lower electrode 203 can be formed of a metal which has a high work function and low reactivity with a dielectric layer 211 formed thereon, such as Pt, Ru, Ir, Rh, Os, and the like. Optionally, a barrier metal layer (not shown in the drawing) can be stacked on the first metal layer comprising Ti or Ti/TiN.

A first sacrificial oxide layer 204, a second metal layer 205, and a second sacrificial oxide layer 206 sequentially stacked over the substrate including the first lower electrode 203. In doing so, the second metal layer 205 can be formed from a single layer of Ti or a double layer of Ti/TiN. In case of forming the double layer as the second metal layer 205, Ti deposition by IMP (ionized metal plasma) or collimator sputtering and TiN deposition by MOCVD (metal organic chemical vapor deposition) are sequentially carried out.

Subsequently, photoresist is coated on the second sacrificial oxide layer 206. Exposure and development are carried out on the photoresist to form a first photoresist pattern 207 exposing a prescribed portion of the second sacrificial oxide layer 206 over a central part of the first lower electrode 203.

Figure 3B:
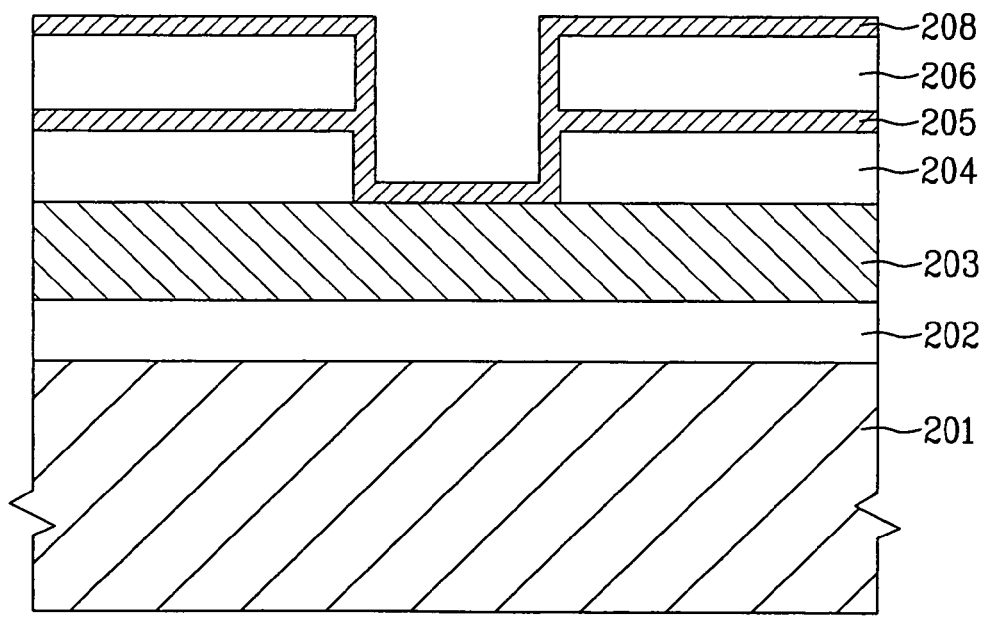

Referring to FIG. 3B, the second sacrificial oxide layer 206, the second metal layer 205, and the first sacrificial oxide layer 204 are sequentially etched using the first photoresist pattern 207 as an etch mask to form a trench exposing the central part of the first lower electrode 203.

And, a third metal layer 208 is formed over the substrate 201 including the exposed central part of the first electrode 203 and the second sacrificial oxide layer 206. In doing so, the third metal layer 208 can be formed from a single layer of Ti or a double layer of Ti/TiN.

Figure 3C:
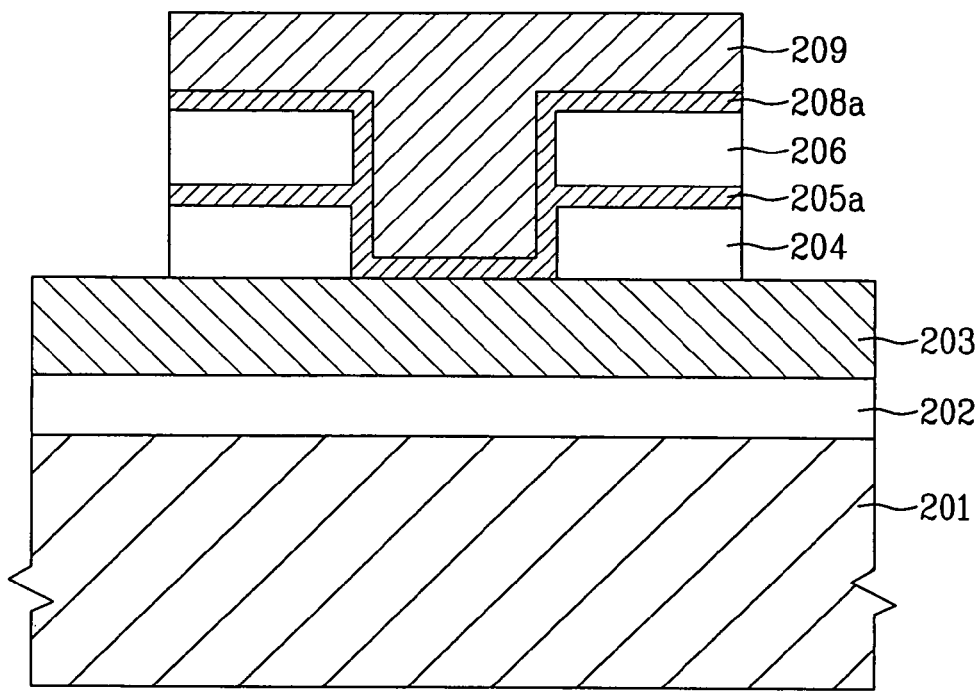

Referring to FIG. 3C, photoresist is coated on the third metal layer 208. Exposure and development are carried out on the photoresist to form a second photoresist pattern 209 defining a second lower electrode forming area.

The third metal layer 208, the second sacrificial oxide layer 206, the second metal layer 205, and the first sacrificial oxide layer 204 are etched using the second photoresist pattern 209 as an etch mask to expose at least a portion of the first lower electrode 203. The exposed portion of first lower electrode 203 may be used for subsequent formation of a contact/via thereto, to connect first lower electrode 203 electrically to overlying metallization (not shown).

Figure 3D:
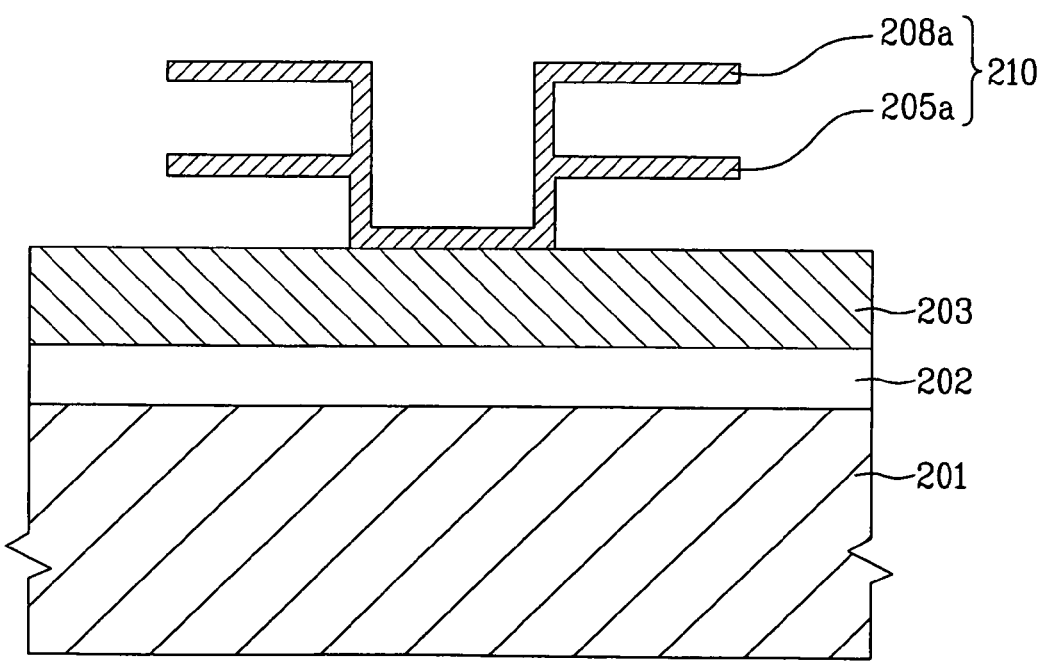

Referring to FIG. 3D, after the second photoresist pattern has been removed, the remaining first and second sacrificial oxide layers 204 are removed by conventional wet etching, or alternatively, by dry etching using a noble gas fluoride etchant (e.g., $XeF_2$). Hence, a second lower electrode 210 having a ᄏF type or wing-type cross-section is formed. Thus, the first lower electrode 203 and the second lower electrode 210 configure a lower electrode of a capacitor. In this case, the second lower electrode 210 includes the second metal layer pattern 205a and the third metal layer pattern 208a.

Figure 3E:
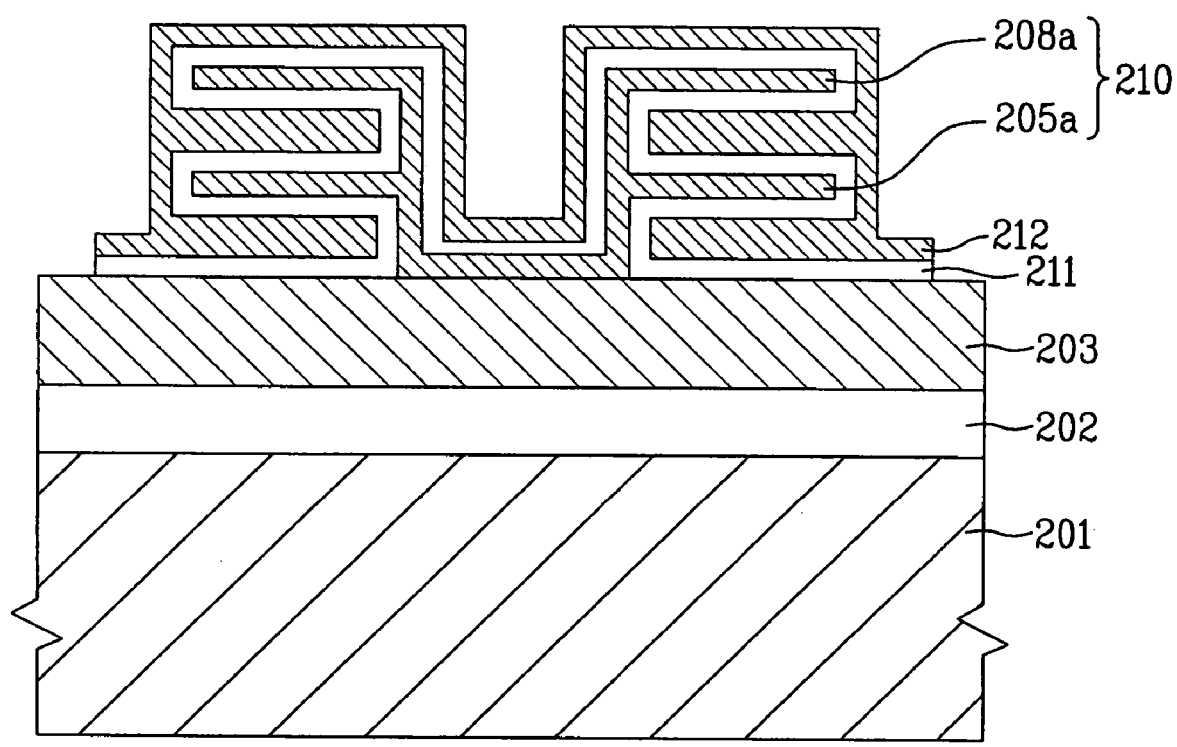

Referring to FIG. 3E, a dielectric layer 211 is formed on a surface of the lower electrode including the first and second lower electrodes 203 and 210 by chemical vapor deposition. Preferably, the dielectric layer 211 can be formed of a material having a high dielectric constant such as a nitride layer. In doing so, the dielectric layer 211 is formed on a surface of the first lower electrode 203 and an entire surface of the second lower electrode 210 having the ᄏF type or wing-type cross-section to increase an effective area of the lower electrode contacting with the dielectric layer 211.

Subsequently, a fourth metal layer for forming an upper electrode is deposited over the substrate including the dielectric layer 211 by chemical vapor deposition. In doing so, the fourth metal layer can be formed of the same material of the first lower electrode 203.

Finally, the fourth metal layer and the dielectric layer 211 are selectively patterned to remain on a specific area to complete a dielectric layer pattern 211 and an upper electrode 212 of the capacitor.

Accordingly, in the present invention, the lower electrode having the ᄏF type or wing type cross-section increases the effective area contacting with the dielectric layer, whereby capacitance of the capacitor is maximized.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a semiconductor device, comprising the steps of:

forming a first lower electrode on a substrate;

sequentially stacking a first sacrificial layer, a first metal layer, and a second sacrificial layer on the first lower electrode;

forming a trench by etching the second sacrificial layer, the first metal layer, and the first sacrificial layer to expose a central part of the first lower electrode;

forming a second metal layer over the substrate including the exposed central part of the first lower electrode and the second sacrificial layer;

patterning the second metal layer, the second sacrificial layer, the first metal layer, and the first sacrificial layer;

removing the remaining first and second sacrificial layers to expose a second lower electrode;

forming a dielectric layer covering surfaces of the first and second lower electrodes; and forming an upper electrode on the dielectric layer.

2. The method of claim 1, wherein the first and second sacrificial layers comprise an oxide.

3. The method of claim 1, wherein removing the first and second sacrificial layers comprises wet etching the first and second sacrificial layers.

4. The method of claim 1, wherein forming the dielectric layer comprises chemical vapor depositing the dielectric layer.

5. The method of claim 1, wherein the upper electrode forming step comprises the steps of:

forming a third metal layer over the dielectric layer; and patterning the third metal layer and the dielectric layer.

6. The method of claim 5, wherein forming the third metal layer comprises chemical vapor depositing the third metal layer.

7. The method of claim 1, wherein patterning the second metal layer, the second sacrificial layer, the first metal layer, and the first sacrificial layer exposes a portion of the first lower electrode.

8. The method of claim 1, wherein the second lower electrode has a wing shape after the remaining first and second sacrificial layers are removed.

* * * * *